(12) United States Patent
Obata et al.

(10) Patent No.: US 8,937,567 B2
(45) Date of Patent: Jan. 20, 2015

(54) DELTA-SIGMA MODULATOR, INTEGRATOR, AND WIRELESS COMMUNICATION DEVICE

(71) Applicant: Panasonic Corporation, Osaka (JP)

(72) Inventors: Koji Obata, Aichi (JP); Kazuo Matsukawa, Osaka (JP); Yosuke Mitani, Osaka (JP); Shiro Dosho, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 134 days.

(21) Appl. No.: 13/779,366

(22) Filed: Feb. 27, 2013

(65) Prior Publication Data
US 2013/0169460 A1 Jul. 4, 2013

Related U.S. Application Data

(63) Continuation of application No. PCT/JP2011/002518, filed on Apr. 28, 2011.

(30) Foreign Application Priority Data

Sep. 7, 2010 (JP) ................. 2010-199917

(51) Int. Cl.
*H03M 3/00* (2006.01)
*H03F 3/45* (2006.01)

(52) U.S. Cl.
CPC ............. *H03M 3/50* (2013.01); *H03F 3/45076* (2013.01); *H03M 3/438* (2013.01)
USPC .......................................... 341/143; 341/155

(58) Field of Classification Search
CPC ....... H03M 3/50; H03M 3/456; H03M 7/304; H03M 3/506; H03F 3/45076
USPC .................................................. 341/155, 143
See application file for complete search history.

(56) References Cited

U.S. PATENT DOCUMENTS 4,301,446 A 11/1981 Petit
6,445,320 B1 9/2002 Noro et al.
(Continued)

FOREIGN PATENT DOCUMENTS

WO WO-2009/133653 A1 11/2009

OTHER PUBLICATIONS

Steven R. Norsworthy, et al., Delta-Sigma Data Converters: Theory, Design, and Simulation pp. 1-6 (1997).
(Continued)

*Primary Examiner* — Jean B Jeanglaude
(74) *Attorney, Agent, or Firm* — McDermott Will & Emery LLP

(57) ABSTRACT

A delta-sigma modulator includes: an integrator having an operational amplifier; a quantizer quantizing an output of the integrator; a first D-A converter converting an output of the quantizer to a current signal to provide negative feedback to the operational amplifier; a feedforward path feeding forward an input of the integrator to the quantizer; and a second D-A converter converting the output of the quantizer to a current signal to provide negative feedback to the quantizer. The integrator includes a resistive element having a first end connected to the input of the integrator and a second end connected to an inverting input of the operational amplifier, n capacitive circuits connected in series between the inverting input and an output of the operational amplifier, and (n−1) resistive elements each having a first end connected to an interconnecting node of the capacitive circuits and a second end connected to a common node.

5 Claims, 6 Drawing Sheets

(56) References Cited

U.S. PATENT DOCUMENTS

| | | | |
|---|---|---|---|
| 6,920,182 B2* | 7/2005 | Bolton, Jr. | 375/247 |
| 7,151,474 B2* | 12/2006 | Ortmanns et al. | 341/143 |
| 7,183,957 B1* | 2/2007 | Melanson | 341/143 |
| 7,193,546 B1* | 3/2007 | Melanson | 341/143 |
| 7,221,302 B1* | 5/2007 | Melanson | 341/143 |
| 2008/0252502 A1 | 10/2008 | Maeda et al. | |
| 2009/0316849 A1* | 12/2009 | Zolfaghari | 375/376 |
| 2011/0050476 A1 | 3/2011 | Dosho et al. | |
| 2011/0133964 A1 | 6/2011 | Dosho et al. | |
| 2011/0169677 A1 | 7/2011 | Dosho et al. | |
| 2011/0254718 A1 | 10/2011 | Matsukawa et al. | |

OTHER PUBLICATIONS

Hiroshi Inose et al., "A Unity Bit Coding Method by Negative Feedback", Proceedings of the IEEE pp. 1524-1535.

Shiro Dosho et al., "A synthesize method of continuous-time delta-sigma modulator using new high-order integrators", The Institute of Electronics, Information and Communication Engineers, pp. 13-18 (2008).

International Search Report mailed Jul. 12, 2011 issued in corresponding International Application No. PCT/JP2011/002518.

* cited by examiner

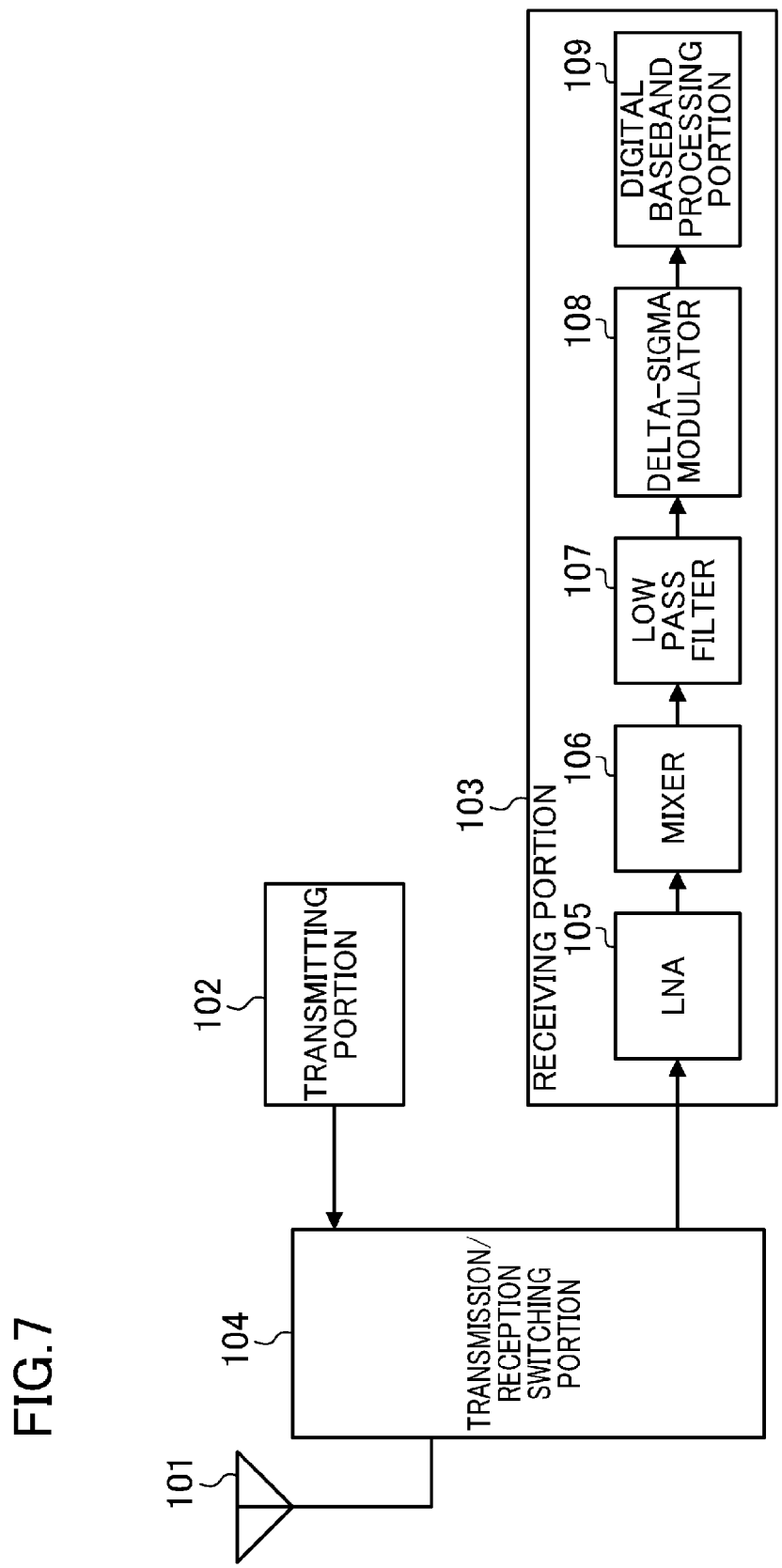

US 8,937,567 B2

DELTA-SIGMA MODULATOR, INTEGRATOR, AND WIRELESS COMMUNICATION DEVICE

CROSS-REFERENCE TO RELATED APPLICATION

This is a continuation of PCT International Application PCT/JP2011/002518 filed on Apr. 28, 2011, which claims priority to Japanese Patent Application No. 2010-199917 filed on Sep. 7, 2010. The disclosures of these applications including the specifications, the drawings, and the claims are hereby incorporated by reference in their entirety.

BACKGROUND

The present disclosure relates to delta-sigma modulators having an integrator.

Currently, delta-sigma modulators are widely used as analog-to-digital (A-D) convertors. The A-D converters using a delta-sigma modulator are characterized by higher accuracy and lower power consumption as compared to Nyquist A-D converters due to noise shaping and oversampling techniques. Among others, continuous time delta-sigma modulators are superior in terms of bandwidth and operation speed.

In typical continuous time delta-sigma modulators, an input signal passes through a plurality of cascaded analog integrators (i.e., continuous time filters) and is quantized by a quantizer. The output of the quantizer is converted to an analog current signal by a digital-to-analog (D-A) converter to provide negative feedback to the integrators (see, e.g., Steven R. Norsworthy, Richard Schereier and Gabor C. Temes, "Delta-Sigma Data Converters Theory, Design, and Simulation," IEEE press, 1997, pp. 1-6, and H. Inose and Y. Yasuda, "A Unity Bit Coding Method by Negative Feedback," Proceedings of the IEEE, Vol. 51, No. 11, November 1963, pp. 1524-1535).

In order to improve accuracy of the delta-sigma modulators, it is necessary to increase the order of the continuous time filters to remove quantization noise. The order of the continuous time filters can be increased by cascading the number of integrators corresponding to the filter order. However, this requires a large number of operational amplifiers, causing an increase in power consumption and chip area. Thus, it is desirable that an integrator implementing a high order transfer function by a single operational amplifier be used for the delta-sigma modulators. A small, low power consumption delta-sigma modulator that includes an integrator achieving high order integration characteristics by a single operational amplifier is implemented by providing a high order RC low pass filter and a high order RC high pass filter in an inverting input portion and a negative feedback portion of the operational amplifier, respectively, and providing negative feedback of the output of a quantizer to each intermediate node of each filter (see, e.g., PCT International Publication No. WO/2009/133653).

This improved delta-sigma modulator requires the high order RC low pass filter in the inverting input portion of the operational amplifier in order to obtain high order integration characteristics. This increases the circuit area of the integrator and also the overall circuit area of the delta-sigma modulator particularly because a capacitive element has a large area. Moreover, this improved delta-sigma modulator requires a large number of D-A converters that provide negative feedback of the output of the quantizer to the intermediate node of the RC low pass filter, and it is difficult to design a D-A converter that is connected to the intermediate node having an unstable potential.

Therefore, there is a need for smaller, lower power consumption delta-sigma modulators and integrators that are preferable for such delta-sigma modulators.

SUMMARY

A delta-sigma modulator according to one aspect of the present disclosure includes: an integrator including an operational amplifier; a quantizer configured to quantize an output of the integrator; a first D-A converter configured to convert a digital output of the quantizer to a current signal to provide negative feedback to an inverting input end of the operational amplifier; a feedforward path configured to feed forward an input signal of the integrator to an input end of the quantizer; and a second D-A converter configured to convert the digital output of the quantizer to a current signal to provide negative feedback to the input end of the quantizer. Preferably, the delta-sigma modulator further includes a switch circuit configured to allow to short-circuit the inverting input end, a non-inverting input end, and an output end of the operational amplifier and a common node. A delta-sigma modulator according to another aspect of the present disclosure includes: an integrator including an operational amplifier; a quantizer configured to quantize an output of the integrator; a D-A converter configured to convert a digital output of the quantizer to a current signal to provide negative feedback to an inverting input end of the operational amplifier; and a switch circuit configured to allow to short-circuit the inverting input end, a non-inverting input end, and an output end of the operational amplifier and a common node.

The above-described integrator may include: a resistive element having a first end connected to an input signal of the integrator and a second end connected to an inverting input end of an operational amplifier; n capacitive circuits connected in series between the inverting input end and an output end of the operational amplifier, "n" representing an integer of 2 or more; and (n−1) resistive elements each having a first end connected to an interconnecting node of the capacitive circuits and a second end connected to a common node. At least one of the n capacitive circuits may include a capacitive element and a resistive element which are connected in series, and may further include a capacitive element connected in parallel to the capacitive element and the resistive element which are connected in series.

BRIEF DESCRIPTION OF THE DRAWINGS

FIG. 7 is a configuration diagram of a wireless communication device according to an embodiment.

DETAILED DESCRIPTION

Embodiments are described in detail below with reference to the attached drawings. However, unnecessarily detailed description may be omitted. For example, detailed description of well-known techniques or description of substantially the same elements may be omitted. Such omission is intended to prevent the following description from being unnecessarily redundant and to help those skilled in the art easily understand it.

Inventor provides the following description and the attached drawings to enable those skilled in the art to fully understand the present disclosure. Thus, the description and the drawings are not intended to limit the scope of the subject matter defined in the claims.

(First Embodiment)

Figure 1:
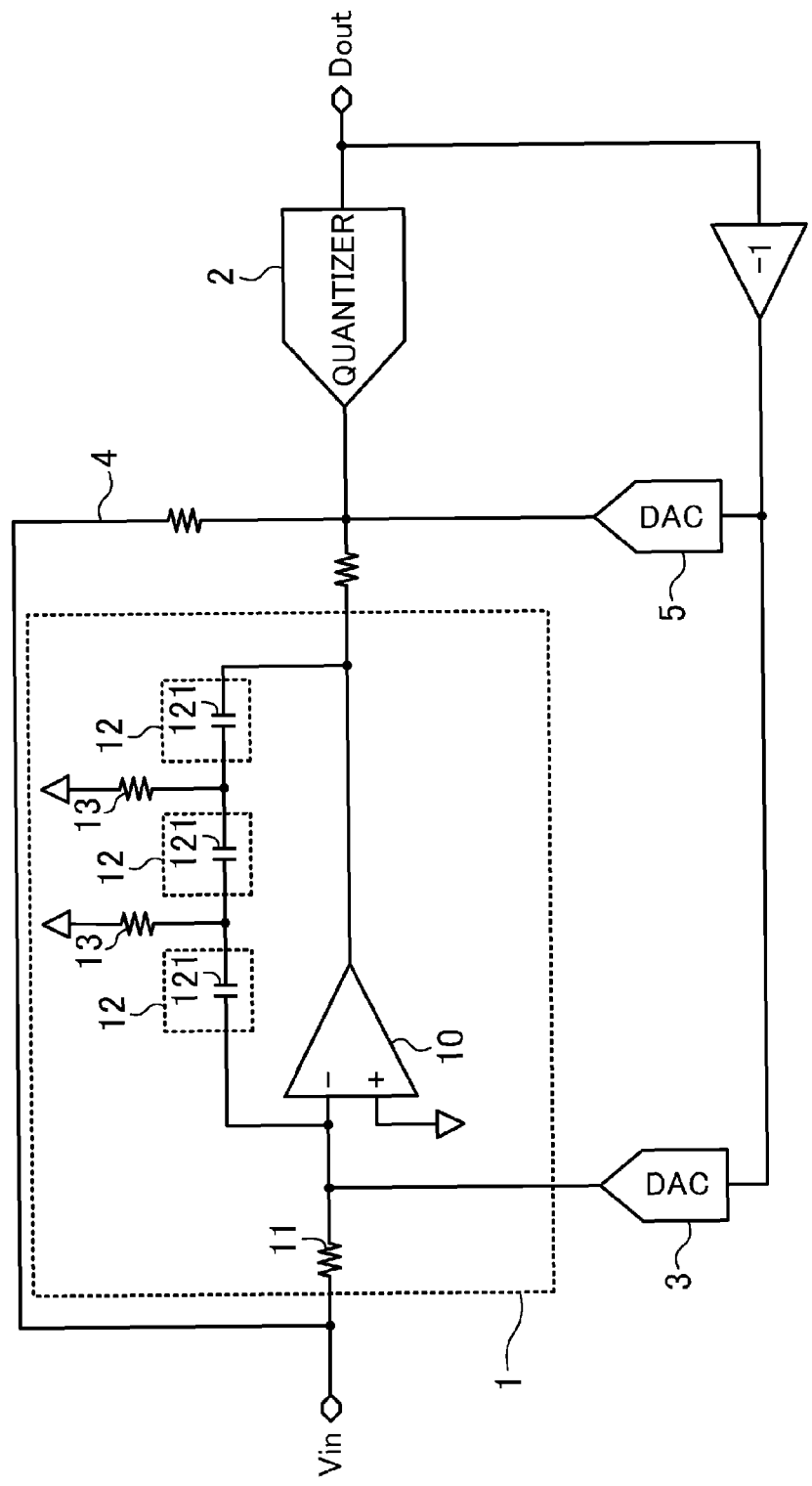
FIG. 1 is a configuration diagram of a delta-sigma modulator according to a first embodiment.

FIG. 1 shows the configuration of a delta-sigma modulator according to a first embodiment. An integrator 1 integrates an analog voltage Vin that is input to the delta-sigma modulator. A specific configuration of the integrator 1 will be described later. A quantizer 2 quantizes an output of the integrator 1. A D-A converter 3 converts a digital output Dout of the quantizer 2 to an analog current signal to provide negative feedback to an inverting input end of an operational amplifier 10 in the integrator 1. A feedforward path 4 bypasses the integrator 1 to feed forward the analog voltage Vin to an input end of the quantizer 2. Providing the feedforward path 4 allows only quantization noise to pass through the integrator 1, whereby linear characteristics, a dynamic range, etc. required for the operational amplifier 10 can be reduced. A D-A converter 5 converts the digital output Dout to an analog current signal to provide negative feedback to the input end of the quantizer 2. That is, the signal fed forward by the feedforward path 4 and the output signal of the D-A converter 5 are added to the output of the integrator 1. In the example of FIG. 1, a resistive element is used to add these signals, but the method of adding the signals is not limited to this.

In the integrator 1, a non-inverting input end of the operational amplifier 10 is connected to a common node, and the analog voltage Vin is input to the inverting input end of the operational amplifier 10 via a resistive element 11. Three series-connected capacitive circuits 12 are inserted in a negative feedback portion between an output end and the inverting input end of the operational amplifier 10. Resistive elements 13 are connected between the common node and an interconnecting node of the capacitive circuits 12, respectively.

Figure 2:
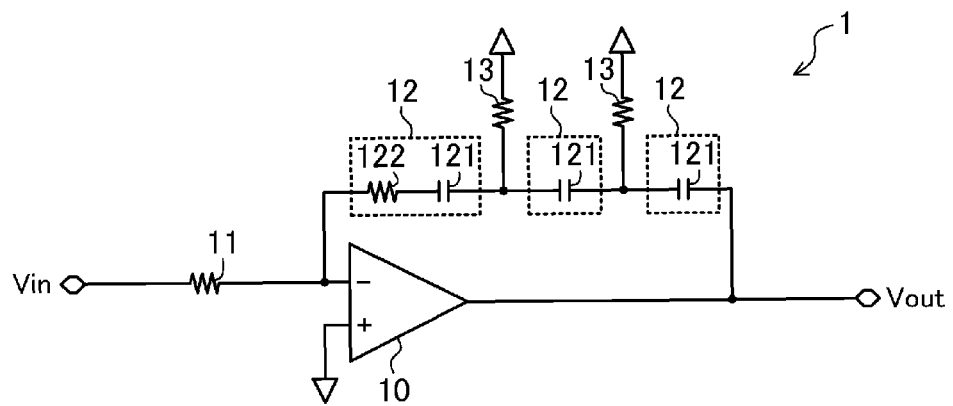
FIG. 2 is a configuration diagram of an integrator according to a modification.

As shown in FIG. 1, each capacitive circuit 12 in the integrator 1 can be formed by a single capacitive element 121. Alternatively, one of the capacitive circuits 12 may be formed by a capacitive element and a resistive element which are connected in series. FIG. 2 shows a modification in which the leftmost capacitive circuit 12 in the integrator 1 of FIG. 1 is formed by a capacitive element 121 and a resistive element 122 which are connected in series. Adding the resistive element 122 can improve the insufficient bandwidth of the operational amplifier 10, and can reduce power consumption of the operational amplifier 10.

Figure 3:
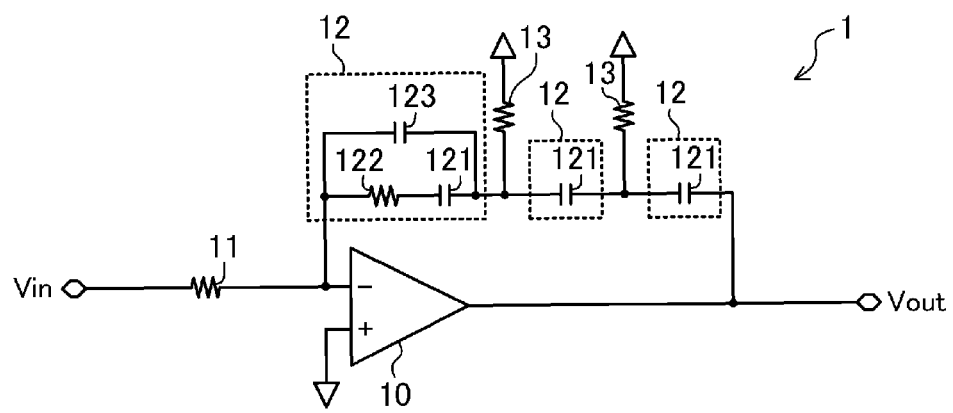
FIG. 3 is a configuration diagram of an integrator according to another modification.

Adding the resistive element 122 to the capacitive circuit 12 may cause ringing in the output current of the D-A converter 3. As a solution, as shown in FIG. 3, a capacitive element 123 may be connected in parallel to the capacitive element 121 and the resistive element 122. Adding the capacitive element 123 can suppress the ringing, and can improve output characteristics of the integrator 1.

Referring back to FIG. 1, the transfer function of the integrator 1 is given by the following expression, where "$R_1$" represents the resistance value of the resistive element 11, "$R_2$" and "$R_3$" respectively represent the resistance values of the resistive elements 13 from left to right in the figure, "$C_1$," "$C_2$," and "$C_3$" respectively represent the capacitance values of the capacitive elements 121 from left to right in the figure, "Vout" represents the output voltage of the integrator 1, and "s" is a Laplace operator. This transfer function shows that the integrator 1 achieves third order integration characteristics by the single operational amplifier 10.

$$\frac{Vout}{Vin} = -\frac{s^2(C_1C_2 + C_2C_3 + C_3C_1)R_2R_3 + s((C_1+C_2)R_2 + (C_2+C_3)R_3) + 1}{s^3 C_1 C_2 C_3 R_1 R_2 R_3} \quad \text{[Expression 1]}$$

As described above, according to the present embodiment, a delta-sigma modulator having third order filtering characteristics can be configured by using the single operational amplifier 10. Moreover, the present embodiment uses only two D-A converters that provide negative feedback of the output of the quantizer 2. Thus, the present embodiment can achieve reduction in size and power consumption of the delta-sigma modulator. The present embodiment also facilitates design of the D-A converter 3 because the output destination of the D-A converter 3 is a virtual ground point of the operational amplifier 10.

The feedforward path 4 can be omitted. In the case where the feedforward path 4 is omitted, the D-A converter 5 can also be omitted. This can achieve further reduction in size and power consumption of the delta-sigma modulator.

(Second Embodiment)

Figure 4:
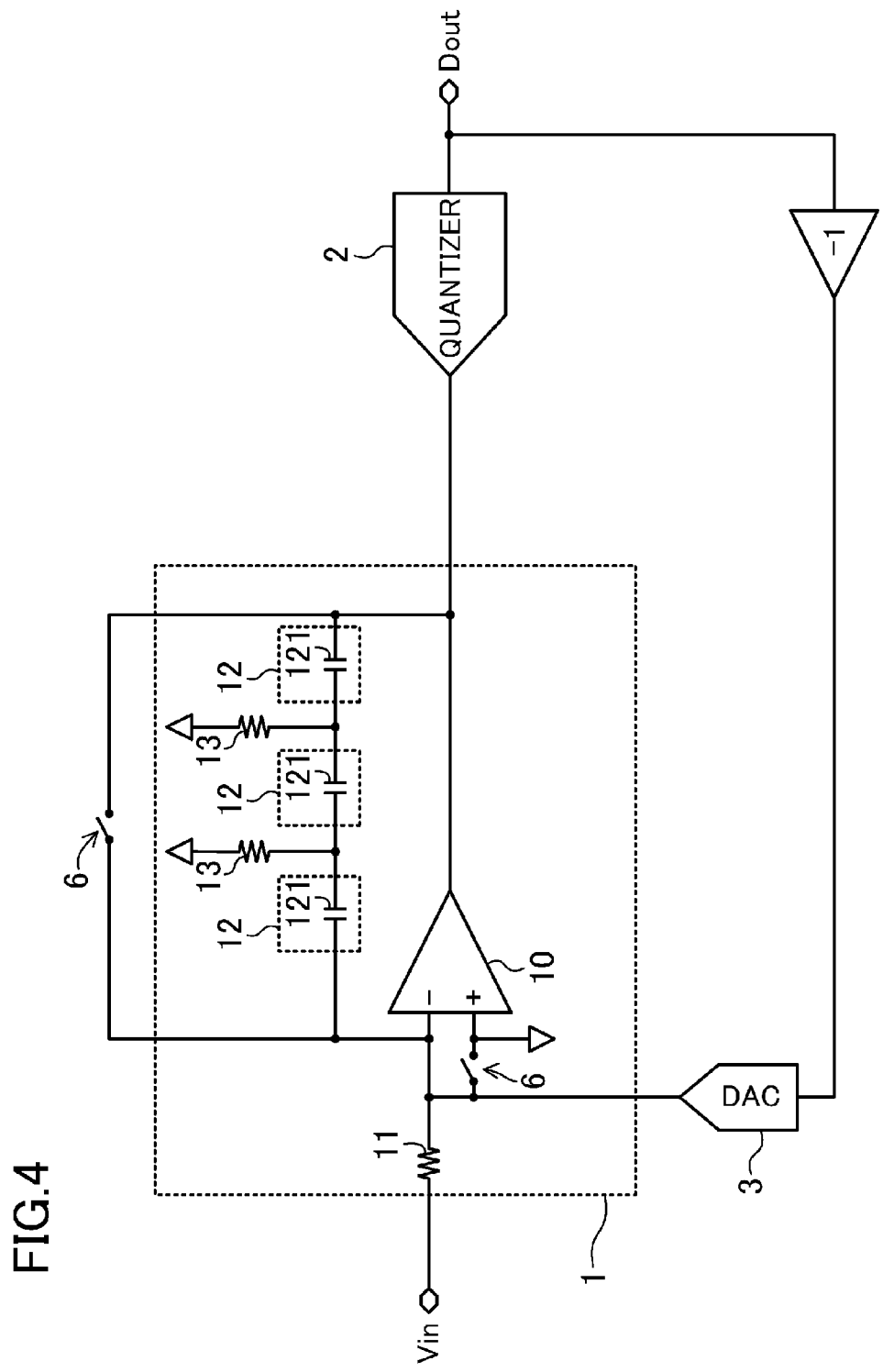
FIG. 4 is a configuration diagram of a delta-sigma modulator according to a second embodiment.

FIG. 4 shows the configuration of a delta-sigma modulator according to a second embodiment. An integrator 1 integrates an analog voltage Vin that is input to the delta-sigma modulator. A specific configuration of the integrator 1 and a modification thereof are as described above. A quantizer 2 quantizes an output of the integrator 1. A D-A converter 3 converts a digital output Dout of the quantizer 2 to an analog current signal to provide negative feedback to an inverting input end of an operational amplifier 10 in the integrator 1.

The delta-sigma modulator further includes a switch circuit 6 configured to allow to short-circuit the inverting input end, a non-inverting input end, and an output end of the operational amplifier 10 and a common node. The switch circuit 6 is OFF during normal operation of the delta-sigma modulator. For example, when the delta-sigma modulator is brought into an oscillation state in response to a signal with excessively high amplitude, the switch circuit 6 is closed to discharge capacitive elements 121 included in capacitive circuits 12. The switch circuit 6 can be inserted at various locations. For example, as shown in FIG. 4, the switch circuit 6 is provided between the inverting input end and the non-inverting input end of the operational amplifier 10 and between the inverting input end and the output end of the operational amplifier 10.

As described above, according to the present embodiment, even if a small, low power consumption delta-sigma modulator is almost brought into or has been brought into the oscillation state in response to an excessively high input etc., the delta-sigma modulator can be restored to a normal state.

(Modification of Delta-Sigma Modulator)

Figure 5:
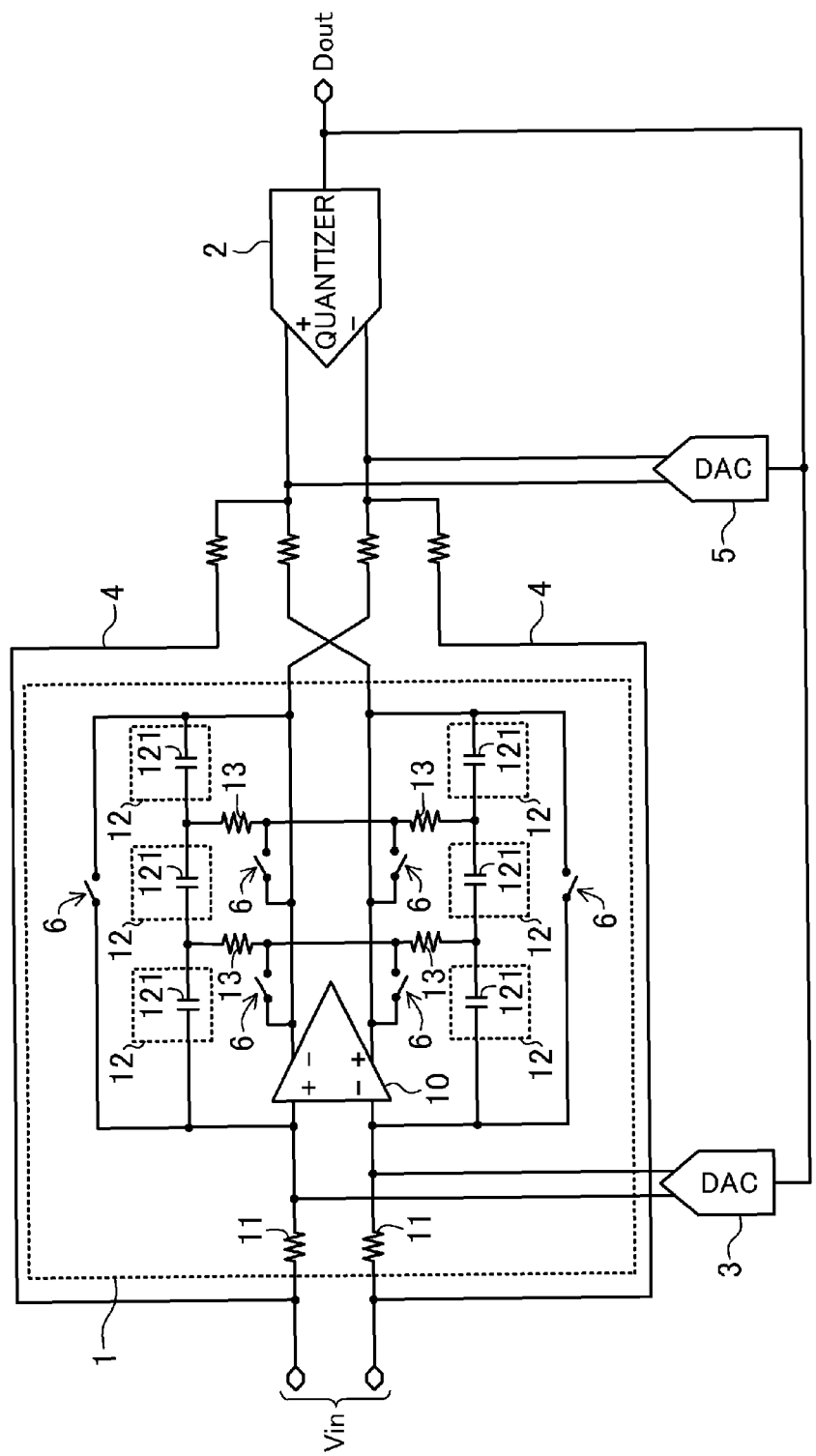
FIG. 5 is a configuration diagram of a delta-sigma modulator according to a modification.
Figure 6:
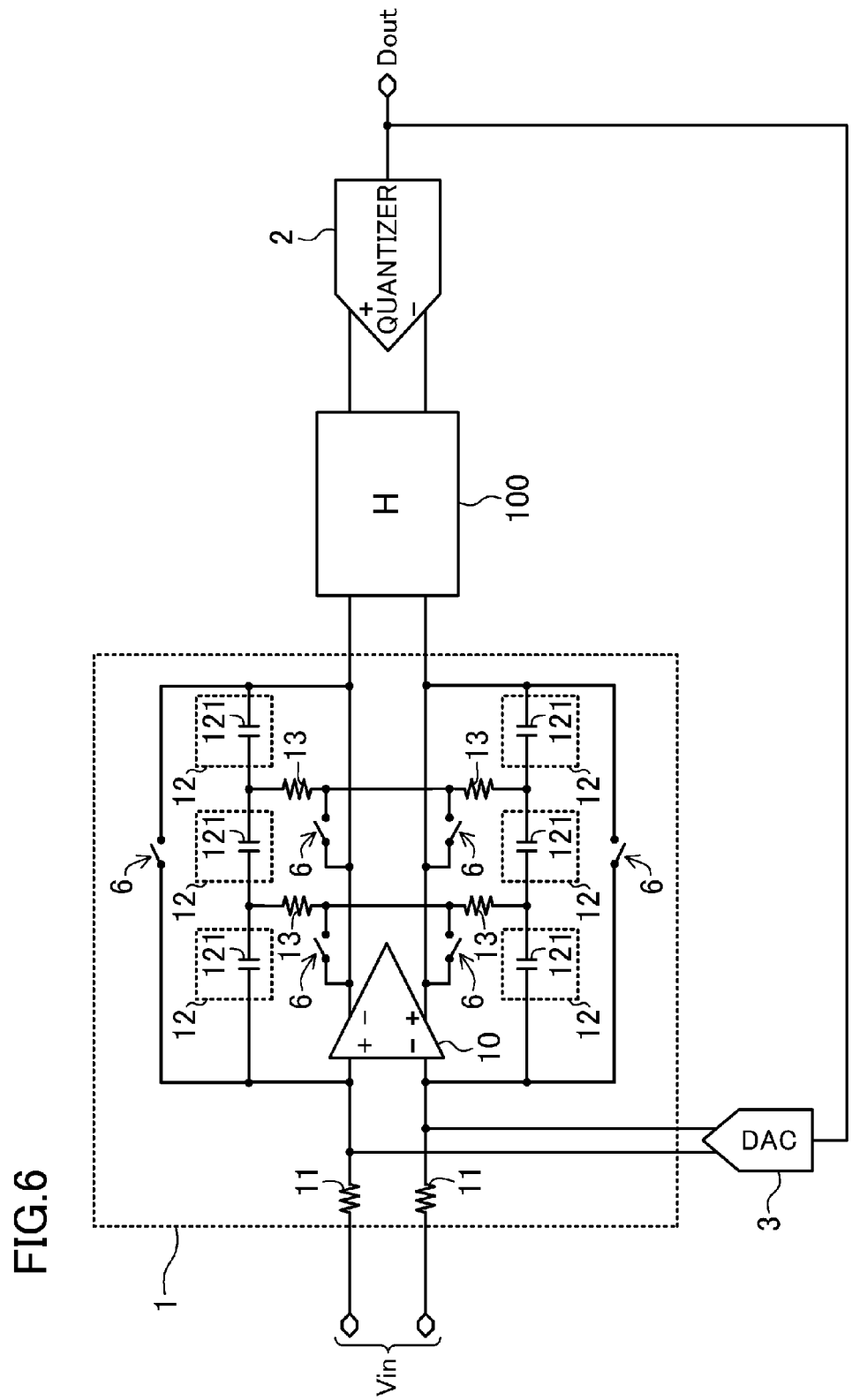
FIG. 6 is a configuration diagram of a delta-sigma modulator according to another modification.

FIG. 5 shows the configuration of a delta-sigma modulator according to a modification. Like this delta-sigma modulator, the delta-sigma modulators of the first and second embodiments may be combined into a differential delta-sigma modulator. As shown in FIG. 6, another filter 100 may be inserted between the integrator 1 and the quantizer 2. The filter 100 is an integrator, a resonator, etc. having any configuration.

In the delta-sigma modulators of the above embodiments and the modifications, the number of capacitive circuits 12 is not limited to three, and may be increased or decreased as desired. For example, a delta-sigma modulator having fourth order transfer characteristics can be configured by providing four capacitive circuits 12.

(Embodiment of Wireless Communication Device)

FIG. 7 shows the configuration of a wireless communication device according to an embodiment. The wireless communication device according to the present embodiment includes an antenna 101 that transmits and receives radio waves, a transmitting portion 102 that performs a predetermined transmission process including a modulation process on a signal to be transmitted, a receiving portion 103 that performs a predetermined reception process including a decoding process on a received signal, and a transmission/reception switching portion 104 that switches between the signal to be transmitted and the received signal. Specifically, the receiving portion 103 includes a low noise amplifier (LNA) 105, a mixer 106, a low pass filter 107, a delta-sigma modulator 108, and a digital baseband processing portion 109. The delta-sigma modulators according to the above embodiments and the modifications can be used as the delta-sigma modulator 109. This can implement a low power consumption, low cost, high accuracy wireless communication device.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above is intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A delta-sigma modulator, comprising:
an integrator including an operational amplifier;
a quantizer configured to quantize an output of the integrator;
a first D-A converter configured to convert a digital output of the quantizer to a current signal to provide negative feedback to an inverting input end of the operational amplifier;
a feedforward path configured to feed forward an input signal of the integrator to an input end of the quantizer; and
a second D-A converter configured to convert the digital output of the quantizer to a current signal to provide negative feedback to the input end of the quantizer,
wherein the integrator includes:
a resistive element having a first end connected to the input signal of the integrator and a second end connected to the inverting input end of the operational amplifier,
n capacitive circuits connected in series between the inverting input end and an output end of the operational amplifier, "n" representing an integer of 2 or more, and
(n-1) resistive elements each having a first end connected to an interconnecting node of the capacitive circuits and a second end connected to a common node,
at least one of the n capacitive circuits includes a capacitive element and a resistive element which are connected in series, and
at least one of the n capacitive circuits includes a capacitive element connected in parallel to the capacitive element and the resistive element which are connected in series.

2. A wireless communication device, comprising: the delta-sigma modulator of claim 1; and a digital baseband processing portion configured to process an output of the delta-sigma modulator.

3. A delta-sigma modulator, comprising:
an integrator including an operational amplifier;
a quantizer configured to quantize an output of the integrator;
a D-A converter configured to convert a digital output of the quantizer to a current signal to provide negative feedback to an inverting input end of the operational amplifier; and
a switch circuit configured to allow to short-circuit the inverting input end, a non-inverting input end, and an output end of the operational amplifier and a common node,
wherein the integrator includes:
a resistive element having a first end connected to an input signal of the integrator and a second end connected to the inverting input end of the operational amplifier,
n capacitive circuits connected in series between the inverting input end and the output end of the operational amplifier, "n" representing an integer of 2 or more, and
(n-1) resistive elements each having a first end connected to an interconnecting node of the capacitive circuits and a second end connected to the common node,
at least one of the n capacitive circuits includes a capacitive element and a resistive element which are connected in series, and
at least one of the n capacitive includes a capacitive element connected in parallel to the capacitive element and the resistive element which are connected in series.

4. A wireless communication device, comprising: the delta-sigma modulator of claim 3; and a digital baseband processing portion configured to process an output of the delta-sigma modulator.

5. An integrator having an operational amplifier, comprising:
a resistive element having a first end connected to an input signal of the integrator and a second end connected to an inverting input end of the operational amplifier;
n capacitive circuits connected in series between the inverting input end and an output end of the operational amplifier, "n" representing an integer of 2 or more; and
(n-1) resistive elements each having a first end connected to an interconnecting node of the capacitive circuits and a second end connected to a common node, wherein at least one of the n capacitive circuits includes a capacitive element and a resistive element which are connected in series,
wherein at least one of the n capacitive circuits includes a capacitive element connected in a parallel to the capacitive element and the resistive element which are connected in series.

* * * * *